United States Patent
Kang et al.

(10) Patent No.: US 12,507,559 B2
(45) Date of Patent: Dec. 23, 2025

(54) DISPLAY DEVICE

(71) Applicant: LG Display Co., Ltd., Seoul (KR)

(72) Inventors: Min Ha Kang, Paju-si (KR); Juhn Suk Yoo, Paju-si (KR); Sung Jin Park, Paju-si (KR); Mi Ran Rim, Paju-si (KR); Jung Hun Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 134 days.

(21) Appl. No.: 17/359,259

(22) Filed: Jun. 25, 2021

(65) Prior Publication Data

US 2021/0408164 A1     Dec. 30, 2021

(30) Foreign Application Priority Data

Jun. 30, 2020   (KR) ..................... 10-2020-0080523

(51) Int. Cl.
*H10K 59/35*   (2023.01)
*H10K 59/65*   (2023.01)

(52) U.S. Cl.
CPC ......... *H10K 59/353* (2023.02); *H10K 59/351* (2023.02); *H10K 59/65* (2023.02)

(58) Field of Classification Search
CPC .......................................... H10K 59/351–353
See application file for complete search history.

(56) References Cited

U.S. PATENT DOCUMENTS

| | | | | |
|---|---|---|---|---|
| 10,923,543 | B1 * | 2/2021 | Chen ..................... | H10K 59/123 |
| 2013/0016313 | A1 * | 1/2013 | Shim ....................... | G02B 5/22 |
| | | | | 359/891 |
| 2020/0052059 | A1 * | 2/2020 | Chen ..................... | H10K 59/179 |
| 2020/0411607 | A1 * | 12/2020 | Jian ....................... | H10K 59/60 |
| 2021/0391400 | A1 * | 12/2021 | Kim ..................... | H10K 59/353 |
| 2022/0199710 | A1 * | 6/2022 | Xu ....................... | G06F 1/1686 |
| 2022/0344432 | A1 * | 10/2022 | Shi ....................... | H10K 59/126 |
| 2022/0392963 | A1 * | 12/2022 | Chen ..................... | H10K 59/121 |
| 2023/0101058 | A1 * | 3/2023 | Zhang ..................... | H10K 59/12 |
| | | | | 257/40 |

FOREIGN PATENT DOCUMENTS

| | | |
|---|---|---|
| CN | 110444125 A | 11/2019 |
| CN | 110867476 A | 3/2020 |
| CN | 111192902 A | 5/2020 |
| KR | 20170024182 A | 3/2017 |
| KR | 20200044245 A | 4/2020 |

* cited by examiner

*Primary Examiner* — Eric K Ashbahian
(74) *Attorney, Agent, or Firm* — Seed Intellectual Property Law Group LLP

(57) ABSTRACT

The present disclosure discloses a display device. The display device includes a first area in which first pixels are disposed at a first density, and a second area in which second pixels are disposed at a second density less than the first density, wherein the second area includes a plurality of second pixel areas in which elements configured to drive or constitute the second pixels are disposed, and a transmission area in which the elements configured to drive or constitute the second pixels are not disposed, and the transmission area is disposed between the adjacent second pixel areas.

17 Claims, 9 Drawing Sheets

DISPLAY DEVICE

CROSS-REFERENCE TO RELATED APPLICATION

This application claims priority to and the benefit of Korean Patent Application No. 2020-0080523, filed on Jun. 30, 2020, the disclosure of which is incorporated herein by reference in its entirety.

BACKGROUND

Technical Field

The present disclosure relates to a display device.

Description of the Related Art

An image display device, which displays various pieces of information on a screen, is a core technology of the information communication age and is being developed to be thinner, lighter, and more portable, and to have higher performance. In addition, various demands for a display device are being increased, and various types of display devices such as a liquid crystal display device, an organic light-emitting display device, a quantum dot display device, and the like are being utilized in accordance with the demands.

Further, in order to provide users with more various application functions, an input device, which uses a touch sensor or the like, and an optical device such as a camera and a proximity sensor are mounted in a display device.

BRIEF SUMMARY

The inventors of the present disclosure have recognized that as the optical device is combined with the display device, there is a problem in the related art that the design of the display device becomes difficult. In particular, the camera and the proximity sensor have to be exposed to the outside for the entrance and exit of light, and thus there is a problem that an active area of a display panel is inevitably reduced.

In the related art, a display device has been designed in a design having a large bezel so that an optical device is installed and exposed, a design in which a display panel is cut out in a notch shape, or a design in which an optical device is exposed through a portion of the display panel in the form of a hole. The inventors have appreciated that, there is a need for a display device without increasing the size of the bezel or forming a special opening (e.g., a notch, a hole, or the like) in the active area, while performing or improving performance of the optical device in the related art.

The present disclosure is directed to propose a display device and a structure of an optical device combined therewith. One or more embodiments of the present disclosure are not limited to addressing the above-described problems, and other technical benefits that are not described herein will be apparently understood by those skilled in the art from the following description.

According to an aspect of the present disclosure, there is provided a display device. The display device includes a first area in which first pixels are disposed at a first density, and a second area in which second pixels are disposed at a second density less than the first density, wherein the second area may include a plurality of second pixel areas in which elements configured to drive or constitute the second pixels are disposed, and a transmission area in which the elements configured to drive or constitute the second pixels are not disposed, and the transmission area is disposed between the adjacent second pixel areas. The second pixel area comprises a plurality of sub-pixel areas, each of the plurality of sub-pixel areas may be spaced apart from another sub-pixel area, which is adjacent thereto in a first direction, at a predetermined (or selected) interval to an extent that allows light to be transmitted therethrough. The display device may further include an optical sensor at a position corresponding to the second area.

Some of the plurality of sub-pixel areas may be spaced apart from another sub-pixel area in a second direction overlapping the first direction with the transmission area therebetween. Some of the other of the plurality of sub-pixel areas may be spaced apart from another sub-pixel area in the second direction without having the transmission area therebetween. A separation distance between the some of the other of the plurality sub-pixel areas and another sub-pixel area adjacent thereto in the second direction may be greater than a separation distance between the plurality of sub-pixel areas in one of the plurality of second pixel areas second pixel area.

At least some of the sub-pixel areas spaced apart from each other in the second direction may be located on a straight line. In a space between the plurality of sub-pixel areas, a line extending in the first direction may not exist, and only a line extending in the second direction may exist. A separation distance between each of the plurality of sub-pixel areas and another sub-pixel area adjacent thereto in the first direction may be greater than or equal to 9 micrometers (μm).

Four of the plurality of sub-pixel areas may be disposed between each of the transmission areas arranged in the first direction or the second direction.

The four sub-pixel areas may be divided into a first group including two sub-pixel areas on one side and a second group including two sub-pixel areas on the other side, and an interval between the first group and the second group may be greater than an interval between the sub-pixel areas in the first group or the second group.

The four sub-pixel areas may be divided into a first group including three sub-pixel areas on one side and a second group including one sub-pixel area on the other side, and the interval between the first group and the second group may be greater than an interval between the sub-pixel areas in the first group. The four sub-pixel areas may be symmetrical with another four sub-pixel areas in the first direction about the transmission area.

Among the four sub-pixel areas, any two sub-pixel areas may be adjacent to each other at an interval less than an interval between the remaining two sub-pixel areas and/or an interval between a group of the any two sub-pixel areas and the sub-pixel area adjacent thereto.

The transmission area may be designed such that light may be incident at a minimum loss, or the transmission areas may be made of transparent insulating materials.

According to another aspect of the present disclosure, there is provided an organic light-emitting display device. The organic light-emitting display device is an organic light-emitting display device in which a plurality of sub-pixels form one pixel, and includes a display panel including a first area in which first pixels are disposed and a second area in which second pixels are disposed at a lower density than the first area, and an optical sensor located to correspond to the second area, wherein each of the first pixels and the second pixels may include a plurality of sub-pixels, the second area may include second pixel areas for the second pixels and a first transmission area between the second pixel areas, and the optical sensor may collect image data through the second area.

The second area includes a second transmission area between adjacent sub-pixel areas forming the second pixel area, and the optical sensor is allowed or configured to collect more uniform image data through the second area as compared with a display device in which the transmission area does not exist between the sub-pixel areas in the second area.

The organic light-emitting display device may have a smaller amount of rapid decrease in a modulation transfer function (MTF) curve of acquired image data than the display device in which the transmission area is not present between the adjacent sub-pixel areas in the second area Details of other embodiments are incorporated in the detailed description and the drawings.

BRIEF DESCRIPTION OF THE SEVERAL VIEWS OF THE DRAWINGS

The above and other technical benefits, features, and advantages of the present disclosure will become more apparent to those of ordinary skill in the art by describing example embodiments thereof in detail with reference to the accompanying drawings, in which.

DETAILED DESCRIPTION

Advantages and features of the present disclosure and a method of achieving the same should become clear with embodiments described in detail below with reference to the accompanying drawings. However, the present disclosure is not limited to embodiments disclosed below and is realized in various other forms. The present embodiments make the disclosure of the present disclosure complete and are provided to completely inform one of ordinary skill in the art to which the present disclosure pertains of the scope of the disclosure.

The figures, dimensions, ratios, angles, numbers, and the like disclosed in the drawings for describing the embodiments of the present disclosure are merely illustrative and are not limited to matters shown in the present disclosure. Like reference numerals refer to like elements throughout. Further, in describing the present disclosure, detailed descriptions of well-known technologies will be omitted when it is determined that they may unnecessarily obscure the gist of the present disclosure. Terms such as "including" and "having" used herein are intended to allow other elements to be added unless the terms are used with the term "only." Any references to the singular may include the plural unless expressly stated otherwise. Components are interpreted to include an ordinary error range even if not expressly stated.

For the description of a positional relationship, for example, when the positional relationship between two parts is described as "on," "above," "below," "next to," and the like, one or more parts may be interposed therebetween unless the term "immediately" or "directly" is used in the expression. When an element or layer is disposed "on" another element or layer, the element is disposed directly on another element or layer or disposed on another element another layer with still another element therebetween. It should be noted that when one component is described as being "connected," "coupled," or "joined" to another component, still another component may be "connected," "coupled," or "joined" between the two components, even though the component may be directly "connected," "coupled," or "joined" to the other component.

Although the terms "first," "second," and the like may be used herein to describe various components, the components are not limited by the terms. The terms are only used to distinguish one component from another. Therefore, a first component described below may be a second component within the technological scope of the present disclosure.

Figure 1:
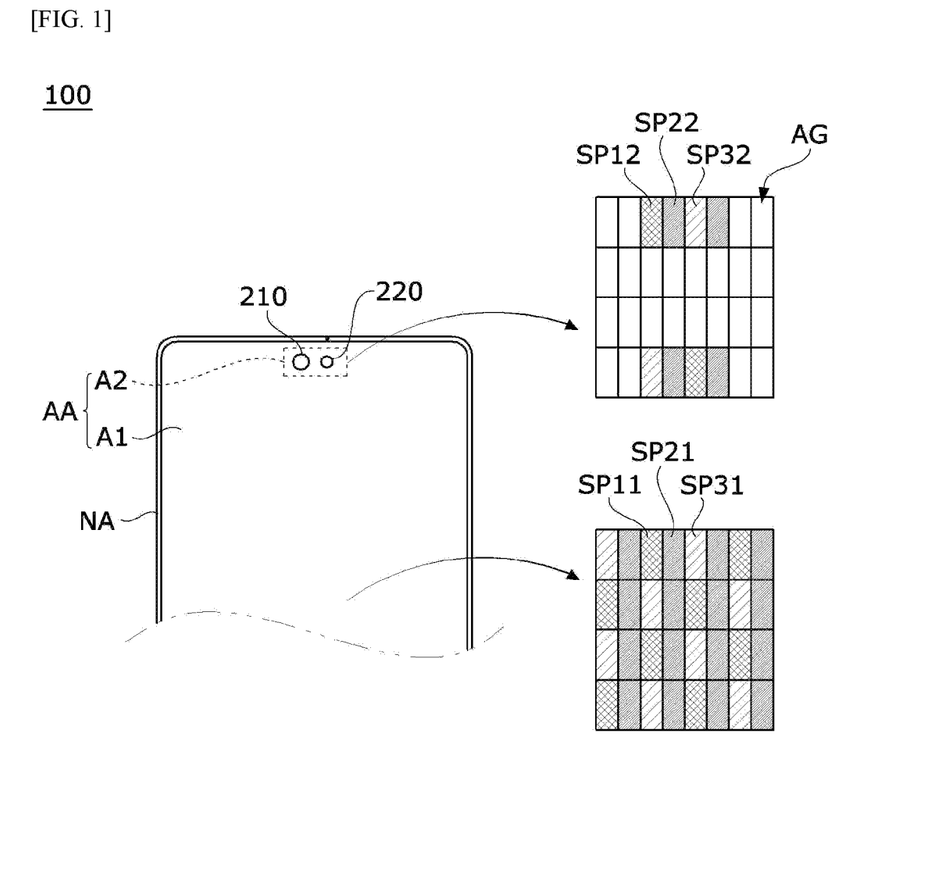
FIG. 1 is a view illustrating a display device according to the present disclosure that may be included in an electronic device.

The size and thickness of each configuration illustrated in the drawings are shown for convenience of description, and the present disclosure is not necessarily limited to the size and thickness of the configuration illustrated. Hereinafter, various embodiments of the present disclosure will be described in detail with reference to the accompanying drawings. FIG. 1 is a view illustrating a display device according to the present disclosure that may be included in an electronic device.

A display device 100 includes at least one active area AA, in which an array of pixels is formed. In addition, one or more non-active areas NA may be disposed around the active area AA. For example, the non-active areas NA may be adjacent to one or more sides of the active area AA. In FIG. 1, the non-active areas NA surround a rectangular-shaped active area AA. However, the shape of the active area AA and the shape/arrangement of the non-active areas NA adjacent to the active area AA are not limited to those illustrated in FIG. 1. The active area AA and the non-active areas NA may have shapes appropriate for the design of an electronic device in which the display device 100 is mounted. For example, the active area AA may have a pentagonal shape, a hexagonal shape, a circular shape, an elliptical shape, or the like, but the present disclosure is not limited thereto.

Each of the pixels in the active area AA may be associated with a pixel circuit. The pixel circuit may be implemented with at least one switching transistor and at least one driving transistor on a backplane. Each pixel circuit may be electrically connected to gate lines and data lines to communicate with one or more driving circuits such as a gate driver and a data driver. The gate driver may be implemented as thin-film transistors (TFTs) in the non-active area NA. The gate driver may be referred to as a gate-in-panel (GIP). In addition, some components such as a data driver integrated circuit (IC) may be mounted on a circuit board such as a flexible printed circuit board (FPCB), a chip-on-film (COF), a tape-carrier-package (TCP), or the like. The circuit boards may be coupled to a connection interface disposed in the non-active areas NA, for example, a pad, a bump, a pin, and the like.

The display device 100 may include various additional elements for generating various signals or driving the pixels in the active area AA. The additional elements for driving the pixels may include an inverter circuit, a multiplexer, an electrostatic discharge (ESD) circuit, and the like. Meanwhile, the display device 100 may include additional elements related to functions other than the pixel driving. For example, the display device 100 may include additional elements for providing a touch sensing function, a user authentication function (e.g., fingerprint recognition), a multi-level pressure sense function, a tactile feedback function, and the like.

The active area AA may include a plurality of areas in which the pixels are disposed at different resolutions (densities). In an example, the active area AA may include a first area A1 having a first resolution and a second area A2 having a second resolution. In this case, the first resolution may be greater than the second resolution. In one embodiment, the first area A1 may occupy most of the active area AA. In addition, the second area A2 may be a partial area excluding the first area A1 in the active area AA, and may be located on one side of the active area AA.

Optical sensors 210 and 220 may be located in an area corresponding to the second area A2. The optical sensors 210 and 220 may include at least one of an image sensor, a proximity sensor, an illumination sensor, a gesture sensor, a motion sensor, a fingerprint recognition sensor, and a biometric sensor. For example, the optical sensors 210 and 220 may be disposed on an area of a rear surface of the display device 100 that overlaps the second area A2 of the active area AA. Since the optical sensors 210 and 220 are disposed as described above, a full-screen display may be implemented without increasing the non-active areas NA or forming a special area (e.g., a notch, a hole, or the like) in the active area AA.

The first area A1 comprises first pixel areas for first pixels and the second area A2 comprises second pixel areas for second pixels. An image is displayed on both of the first and second areas A1 and A2, but second pixels comprising sub-pixels SP12, SP22, and SP32 may be disposed in the second area A2 at a density less than that of first pixels comprising sub-pixels SP11, SP21, and SP31 of the first area A1. This is to increase the light transmittance of the second area A2 so that the optical sensors 210 and 220 may easily detect light incident from the outside. In order to improve the light transmittance, a transmission area AG (or a transparent area) in which the second sub-pixels SP12, SP22, and SP32 of the second pixel are not disposed is provided in the second area A2. Thus, the transmission area AG is disposed between the adjacent second pixel areas. Various types of light-reflective elements (such as metal lines/electrodes) may not be disposed in the transmission area AG, or only elements made of a material having high transmittance may be disposed. Meanwhile, an image quality compensation algorithm may be applied to compensate for a brightness variation and a color coordinate variation caused by the sub-pixels that are disposed in a relatively small number in the second area A2.

Figure 2:
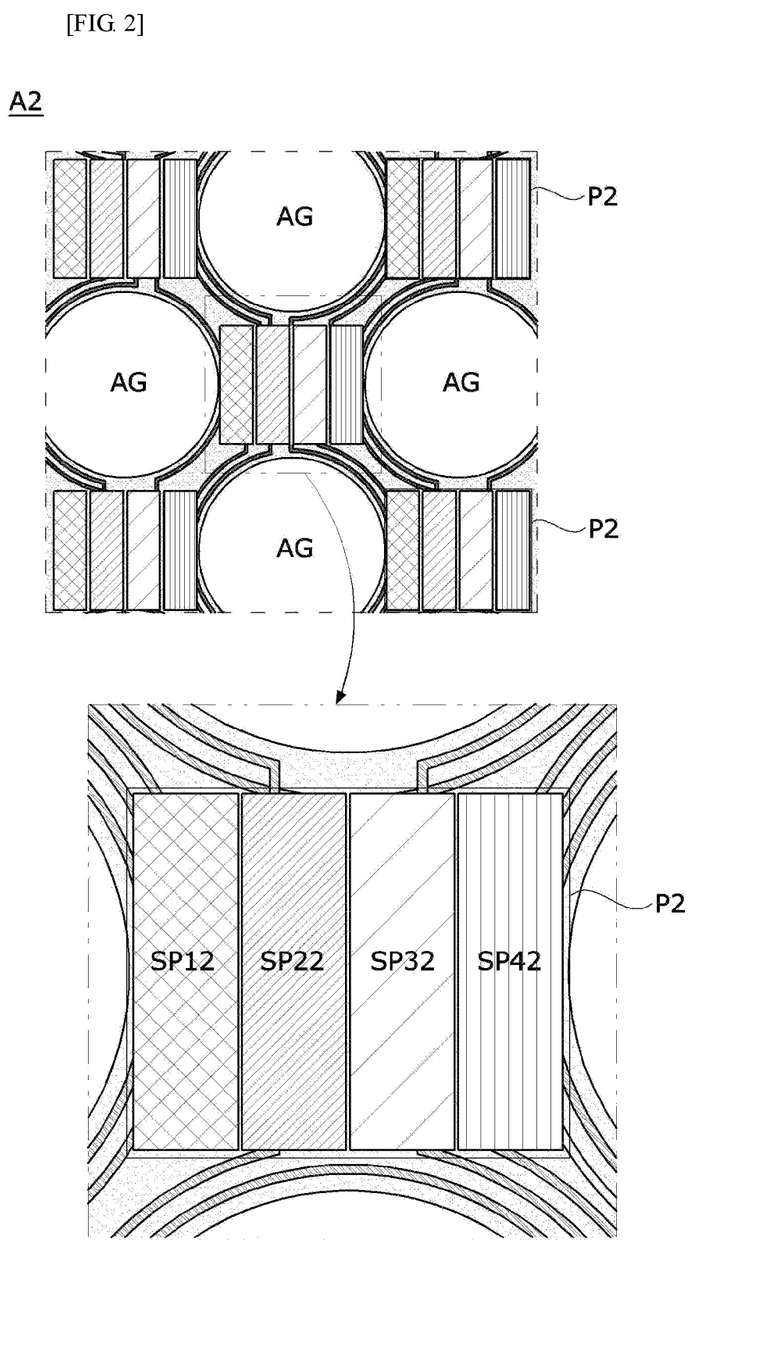
FIG. 2 is a plan view illustrating an arrangement of pixels in a second area of a display device according to one embodiment of the present disclosure.

FIG. 2 is a plan view illustrating an arrangement of pixels in the second area according to one embodiment of the present disclosure.

As described above, the second area A2 may be a kind of capturing-performed area through which the optical device (e.g., a camera) recognizes an image of an object. The second area A2 may include second pixels P2 each having a plurality of sub-pixels. Each of the second pixels P2 may include two to four sub-pixels. For example, the second pixel P2 may include red (R), green (G), and blue (B) sub-pixels, or may further include a white (W) sub-pixel.

FIG. 2 illustrates the second pixels P2 each including four sub-pixels SP12, SP22, SP32 and SP24. The second pixels P2 shown in FIG. 2 may operate as one or two pixels.

Transmission areas AG may be disposed between the second pixel areas in the second area A2. External light may be introduced into the optical device through the transmission areas AG. The transmission areas AG may be designed such that the light may be incident at a minimum loss. In an example, the transmission areas AG may each be made of transparent insulating materials without including the sub-pixels and/or the metal lines. The shape of the transmission area AG is illustrated as a circular shape, but the present disclosure is not limited thereto. For example, the transmission area AG may be designed in various forms such as a circular shape, an elliptical shape, a polygonal shape, or the like.

In order to increase light transmittance, metal materials may be removed from the transmission areas AG. In this case, the elements for driving or constituting the sub-pixels and the electrodes/lines may be disposed outside the transmission areas AG. However, the present disclosure is not necessarily limited thereto, and the metal electrode material may remain in a partial area of the transmission area AG.

Figure 3A:
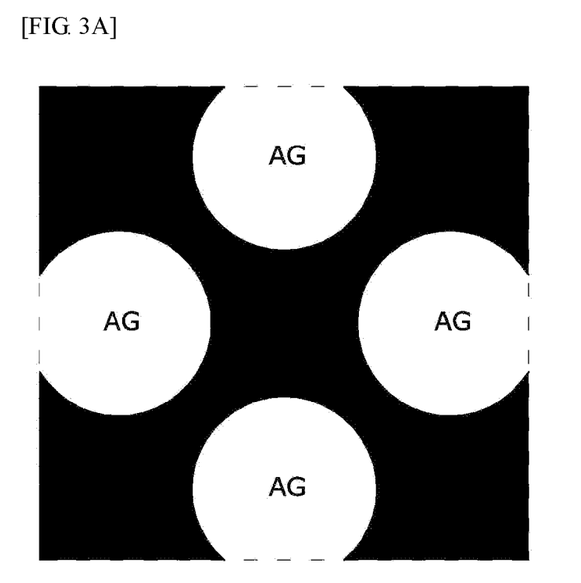
FIGS. 3A and 3B are diagrams for describing an analysis of an image captured through the second area as shown in FIG. 2.
Figure 3B:
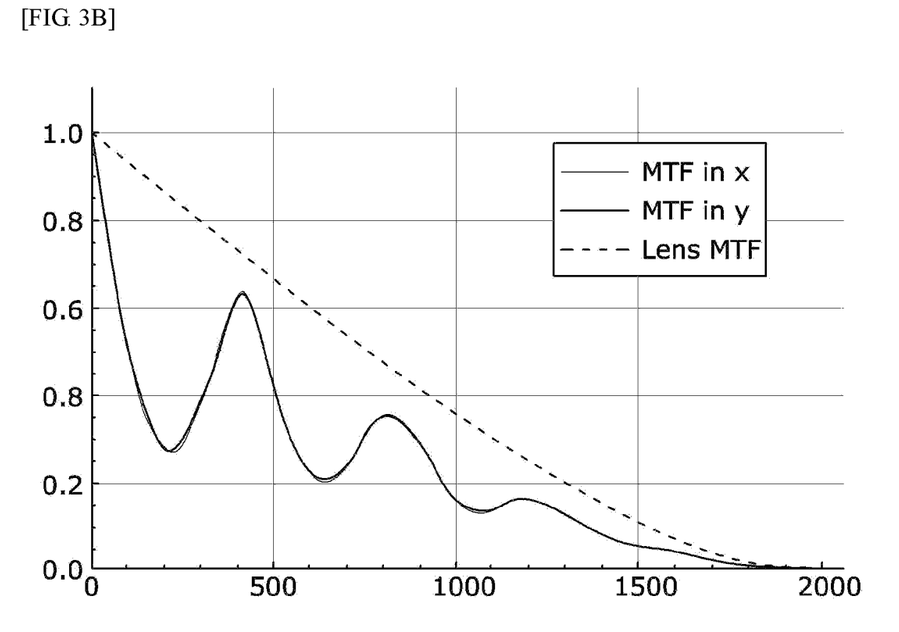

Therefore, the optical sensors 210 and 220 can receive light incident from the outside of the display device through the transmission area AG so as to provide a full-screen display panel. FIGS. 3A and 3B are diagrams for describing an analysis of an image captured through the second area as shown in FIG. 2.

It should be noted that the sub-pixel areas for the sub-pixels are not spaced part from each other at a predetermined (or selected) interval to an extent that allows light to be transmitted therethrough in the structure as shown in FIG. 2. The inventors have discovered a problem occurring in the structure in which the sub-pixels and the transmission areas are disposed as shown in FIG. 2. One among these is that processing image data acquired through the second area A2 by the optical device in a conventional manner is difficult. In the case of the structure as shown in FIG. 2, the area at the time the optical device receives the light through the second area A2 may be illustrated as in FIG. 3A. In FIG. 3A, it is illustrated that almost the entire amount of light is received through the transmission areas AG, and almost no light is received through the other areas (areas in which the elements constituting the sub-pixels are disposed). The problem found by the inventors is that, when light is received through only certain areas (determined transmission areas), the quality of a captured image is not sufficient to meet a certain level even though the entire amount of the received light is sufficient for some particular applications.

A modulation transfer function (MTF) curve of a general optical lens has a shape like a dotted line in FIG. 3B. This means that a small amount of data is acquired in a portion in which many objects that block light are concentrated and thus light is blocked, and in contrast, a large amount of data is acquired in a portion in which there are few objects that block the light and thus a large amount of light is incident. In this case, many techniques for easily processing the acquired image data are known.

However, an MTF curve of image data collected under the condition as in FIG. 3A is illustrated as in FIG. 3B. In FIG. 3B, the MTF curve of the image data has rapidly decreasing points (valley-like) as compared with the MTF curve of the optical lens itself, and thus it is difficult to optimally perform image processing. That is, it can be seen that, in the MTF curve having the above-described shape, data processing is difficult to be performed because the amount of data acquired is not constantly changed along the light-blocking pattern (the density of the sub-pixels). In particular, when the amount of data acquired at a point (the point at which the curve sharply decreases) at which a large amount of information is predicted to be acquired is very small, the probability of generating noise or distortion increases when the acquired image data is processed.

This is considered to be a phenomenon that occurs because external light is introduced through only the limited transmission areas. Thus, the inventors of the present disclosure have designed an arrangement structure of image capturing areas, which is more advantageous for the collection and processing of image data.

FIGS. 4A to 4E are plan views illustrating an arrangement of pixels in a second area of a display device according to further embodiments of the present disclosure.

The display device according to the further embodiment of the present disclosure includes an active area AA, on which an image is displayed, and a non-active areas NA around the active area AA. The non-active area NA does not display an image, and may include peripheral elements (gate drivers, power lines, and the like) associated with elements of the active area AA.

The active area AA includes a first area A1 and a second area A2. As described in FIG. 1, both the first area A1 and the second area A2 are areas on which an image is displayed. The display device may further include an optical sensor (e.g., a camera) at a position corresponding to the second area A2.

Sub-pixels of the first pixels and the second pixels may be disposed in the first and second areas A1 and A2 in different ways depending on the utilization. In one embodiment, first pixels SP11, SP21, and SP31 may be disposed in the first area A1 at a first density PPI_1, and second pixels SP12, SP22, and SP32 may be disposed in the second area A2 at a second density PPI_2 less than the first density PPI_1. That is, PPI_1>PPI_2. Here, the first area A1 may be referred to as a high-resolution area, and the second area A2 may be referred to as a low-resolution area. The density (resolution) of some sub-pixels in the active area AA is designed differently as one method of increasing the amount of light collected by the optical sensor through the corresponding area.

The second area A2 may include a plurality of second pixel areas comprising a plurality of sub-pixel areas SP1, SP2, SP3 and SP4 in which elements configured to drive or constitute the second sub-pixels are disposed, and transmission areas AG in which the elements configured to drive or constitute the second sub-pixels are not disposed. Here, each of the sub-pixel areas SP1, SP2, SP3 and SP4 means an area in which the elements configured to drive or constitute each sub-pixel are disposed. The embodiments of FIGS. 4A to 4E also have additional transmission areas between the sub-pixel areas SP1, SP2, SP3 and SP4 unlike the embodiment of FIG. 2. For example, each of the plurality of sub-pixel areas may be spaced apart from another sub-pixel area, which is adjacent thereto in a first direction (e.g., an x direction), by a predetermined (or selected) interval (e.g., greater than or equal to 9 μm) to an extent that allows light to pass therethrough. That is, one sub-pixel area (e.g., "SP2") is spaced apart from each of the sub-pixel areas (e.g., "SP1" and "SP3") on both sides thereof by a predetermined (or selected) interval. The interval between adjacent sub-pixel areas may be 8% to 10% of a width of a transmission area AG disposed between the adjacent second pixel areas.

Figure 5A:
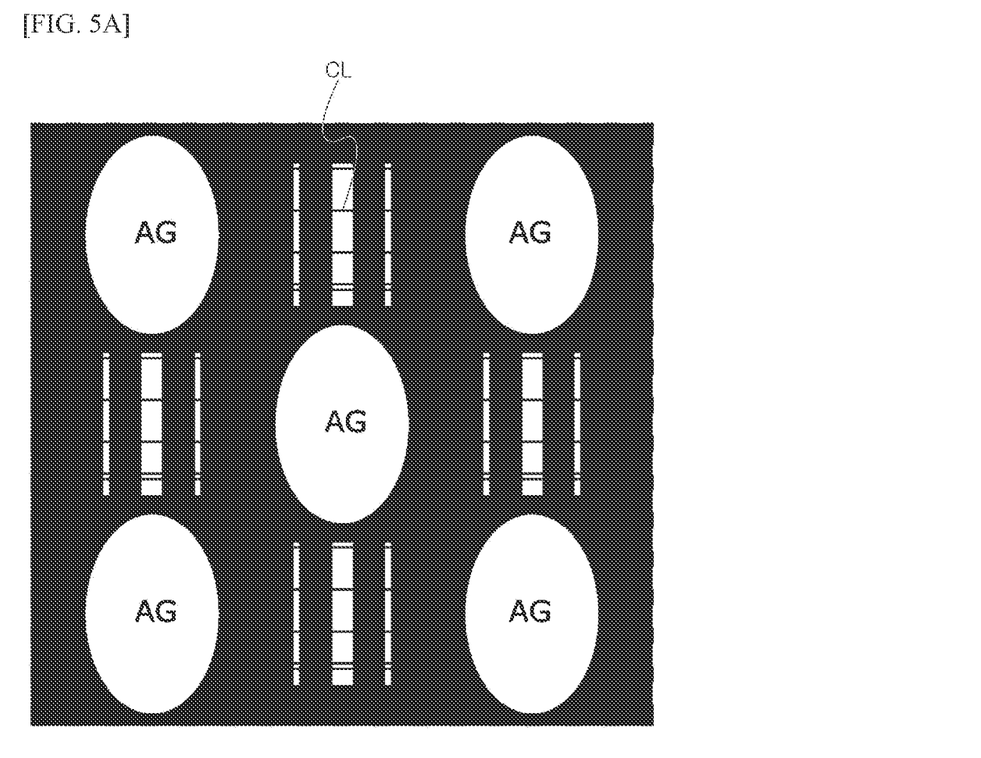
FIGS. 5A and 5B are diagrams for schematically describing an analysis of an image captured through the second area

Meanwhile, in a space between the sub-pixel areas, nothing may be disposed except for the minimum necessary elements (e.g., connection lines CL in the x axis direction as shown in FIG. 5A). In an example, in the space between the plurality of sub-pixel areas, lines extending in a second direction may not exist, and only lines extending in the first direction may exist. The sub-pixel areas are spaced apart from each other by a sufficient distance as described above to improve the characteristics of image data by further dispersing areas through which the optical sensor recognizes incident light.

A predetermined (or selected) number of sub-pixels area are gathered to form one (or two or more) the second pixel area, and a transmission area AG may be provided between each the second pixel area (or a sub-pixel area group). In contrast, the transmission areas AG are arranged in the first direction and the second direction, and the second pixel area or the sub-pixel area group is located between the transmission areas AG. Each of the second pixel areas, which are illustrated in FIGS. 4A to 4E, includes sub-pixel areas "SP1," "SP2," "SP3," and "SP4" and is surrounded by the transmission areas AG. That is, the second pixel areas are spaced apart from each other with the transmission area AG therebetween.

Accordingly, some of the plurality of sub-pixel areas SP1, SP2, SP3, and SP4 constituting the second pixel area may be spaced apart from another sub-pixel area in the second direction (e.g., y axis direction) with the transmission area AG therebetween. For example, a first unit pixel area P21 may be spaced apart from a third unit pixel area P23 in the second direction with the transmission area AG therebetween.

In addition, some of the other of the plurality of sub-pixel areas may be spaced apart from another sub-pixel area in the second direction without having the transmission area therebetween. When a description is made with reference to the drawings, among the sub-pixel areas SP1, SP2, SP3, and SP4 of the second pixel areas located in an arbitrary row, the sub-pixel area SP2 or SP3 located in an inner side is spaced apart from the sub-pixel area of each of the second pixel areas in the lower or upper row with the transmission area AG therebetween. In addition, among the sub-pixel areas SP1, SP2, SP3, and SP4 of the second pixel area located in an arbitrary row, the sub-pixel area SP1 or SP4 located in the outmost sides may be spaced apart from the sub-pixel area SP1 or SP4 of each of the second pixel areas in the lower or upper row without having the transmission area AG therebetween.

A separation distance between some of the other of the plurality of sub-pixel areas SP1, SP2, SP3, and SP4 and another sub-pixel area in the second direction may be greater than a separation distance between the adjacent sub-pixel areas of the plurality of sub-pixel areas SP1, SP2, SP3, and SP4 of second pixel areas in a first direction.

For example, a separation distance D4 in which the fourth sub-pixel area SP4 of the first unit pixel area P21 is spaced apart from the first sub-pixel area SP1 of the second unit pixel area P22 in the second direction may be greater than a separation distance D1a in which the plurality of sub-pixel areas SP1, SP2, SP3, and SP4 in the first unit pixel area P21 are spaced apart each other in the first direction.

In addition, a separation distance between the sub-pixel areas SP1, SP2, SP3, and SP4 spaced apart from each other in the second direction without having the transmission area AG therebetween may be greater than a separation distance between the sub-pixel areas SP1, SP2, SP3, and SP4 in the second pixel area spaced apart from each other in the first direction.

At least some of the sub-pixel areas spaced apart from each other in the second direction may be located on a straight line. In the embodiments of FIGS. 4A to 4E, it can be seen that the sub-pixel areas at the outermost sides among the sub-pixel areas in each of the second pixel areas are located on one straight line L1 in the second direction, that is, the sub-pixel areas slightly overlap each other in the second direction. The pixel areas are arranged to overlap each other between upper and lower rows as described above in order to have the advantage of increasing the interval between sub-pixel areas in one second pixel area. In the embodiments of FIGS. 4A to 4E, four sub-pixel areas are disposed between the transmission areas AG arranged in the first direction or the second direction. That is, FIGS. 4A to 4E illustrate the embodiments in a case in which four sub-pixel areas SP1, SP2, SP3, and SP4 form one second pixel area. However, FIGS. 4A to 4E are only example embodiments, and the types of sub-pixels included in one second pixel area may vary.

Figure 4A:
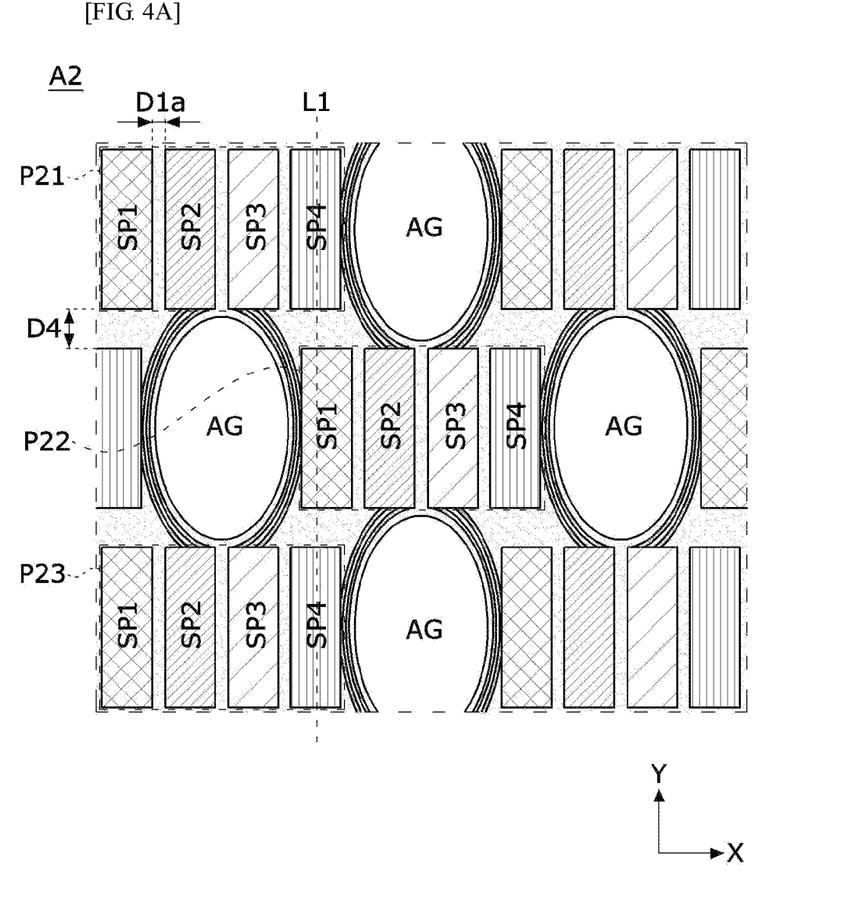
FIGS. 4A to 4E are plan views illustrating an arrangement of pixels in a second area of a display device according to further embodiments of the present disclosure.

FIG. 4A illustrates an embodiment in which intervals between the sub-pixel areas SP1, SP2, SP3, and SP4 in one second pixel area are substantially constant. In the arrangement structure shown in FIG. 4A, the optical sensor may also receive light through a space between the sub-pixel areas SP1, SP2, SP3 and SP4. Thus, in the arrangement structure shown in FIG. 4A, light-receiving areas may be variously distributed as compared with the structure of FIG. 2, so that image data may be obtained more stably.

Figure 4B:
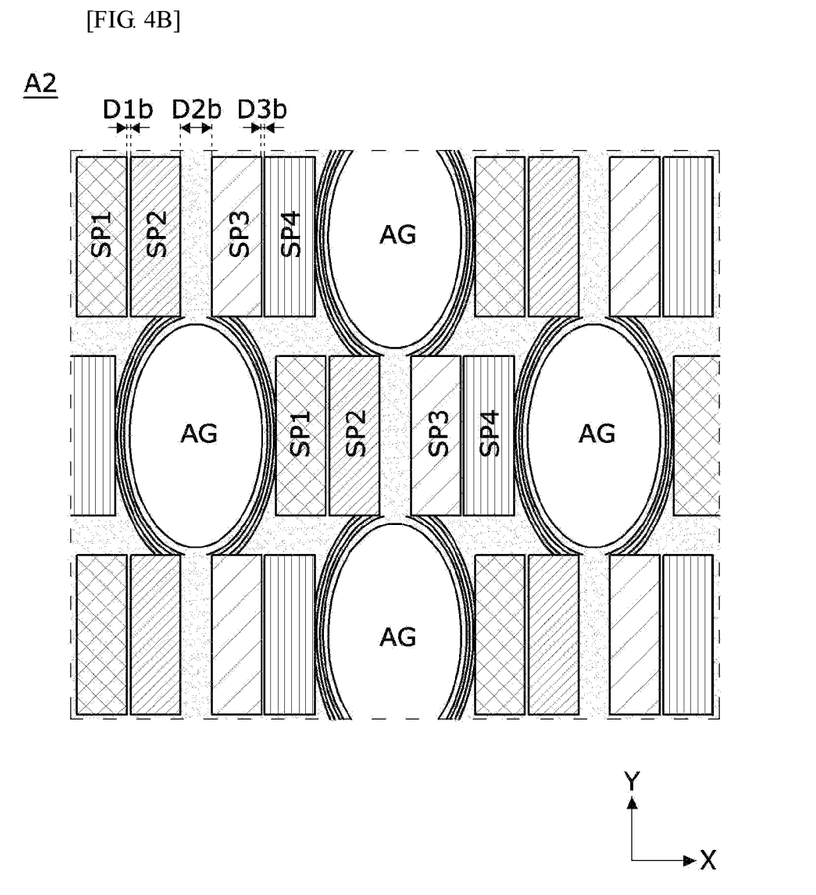

FIG. 4B illustrates an embodiment in which intervals between the sub-pixel areas SP1, SP2, SP3, and SP4 in one second pixel area are not constant. In the embodiment of FIG. 4B, the four sub-pixel areas have a larger interval between two groups. That is, the four sub-pixel areas are divided into a first group including two sub-pixel areas (e.g., "SP1" and "SP2") on one side and a second group including two sub-pixel areas (e.g., "SP3" and "SP4") on the other side. An interval D2$b$ between the first group and the second group is greater than an interval D1$b$ between the sub-pixel areas (e.g., "SP1" and "SP2") in the first group or an interval D3$b$ between the sub-pixel areas (e.g., "SP3" and "SP4") in the second group.

Figure 4C:
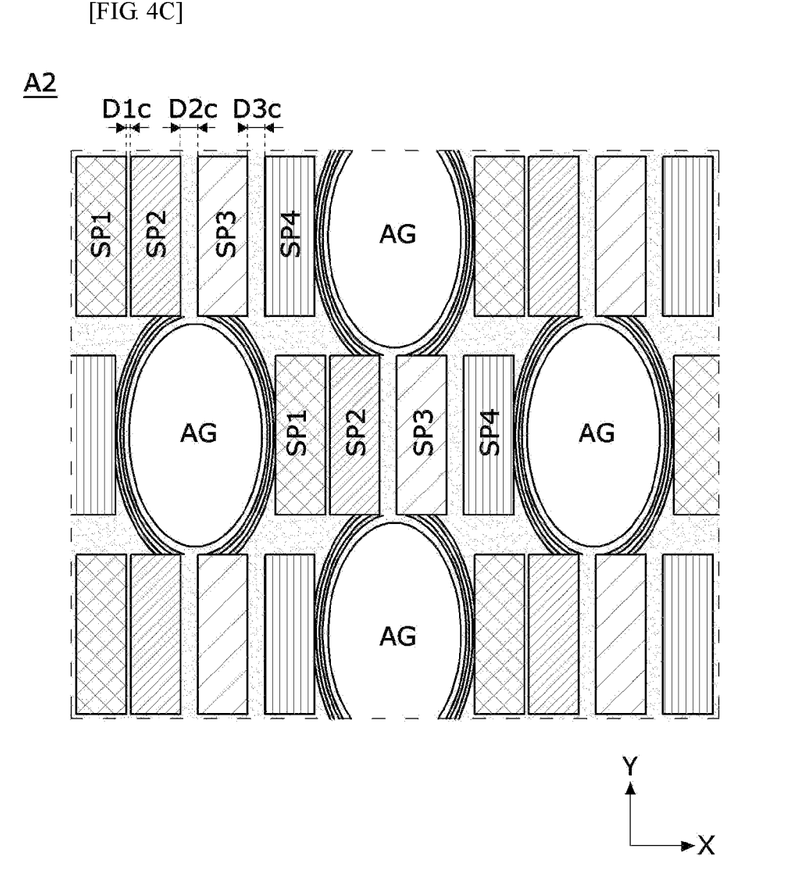

FIG. 4C illustrates an embodiment in which, among the four sub-pixel areas, any two sub-pixel areas (e.g., "SP1" and "SP2") are adjacent to each other at an interval less than an interval between the remaining two sub-pixel areas (e.g., "SP3" and "SP4") and/or an interval between a group of the any two sub-pixel areas and the adjacent sub-pixel area (e.g., "SP3"). That is, a separation distance D1$c$ between the any two adjacent sub-pixel areas is relatively small, and a separation distance D3$c$ between the remaining two sub-pixel areas and a separation distance D2$c$ between a group of the any two adjacent sub-pixel areas and the adjacent sub-pixel area is greater than the separation distance D1$c$. In this case, the group of the any two sub-pixel areas may be variously selected, as two on the left, two on the right, or two in the middle. In addition, the arrangement form of the sub-pixel areas may be substantially constant in the entire second area A2, and may be horizontally and/or vertically symmetrical about the transmission area AG.

Figure 4D:
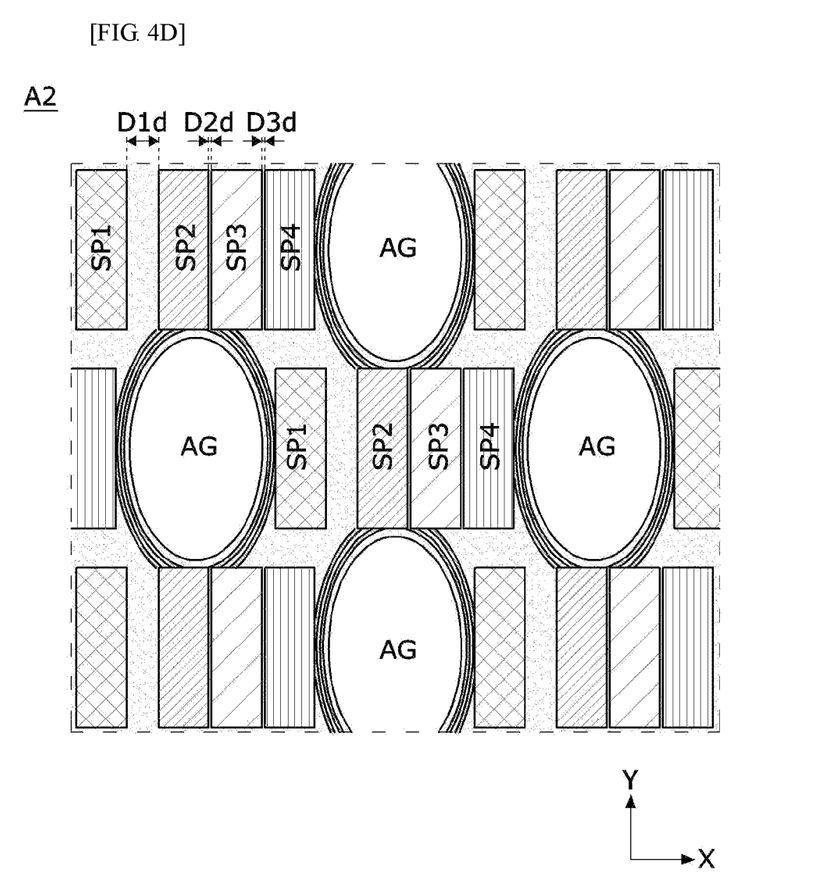
Figure 4E:
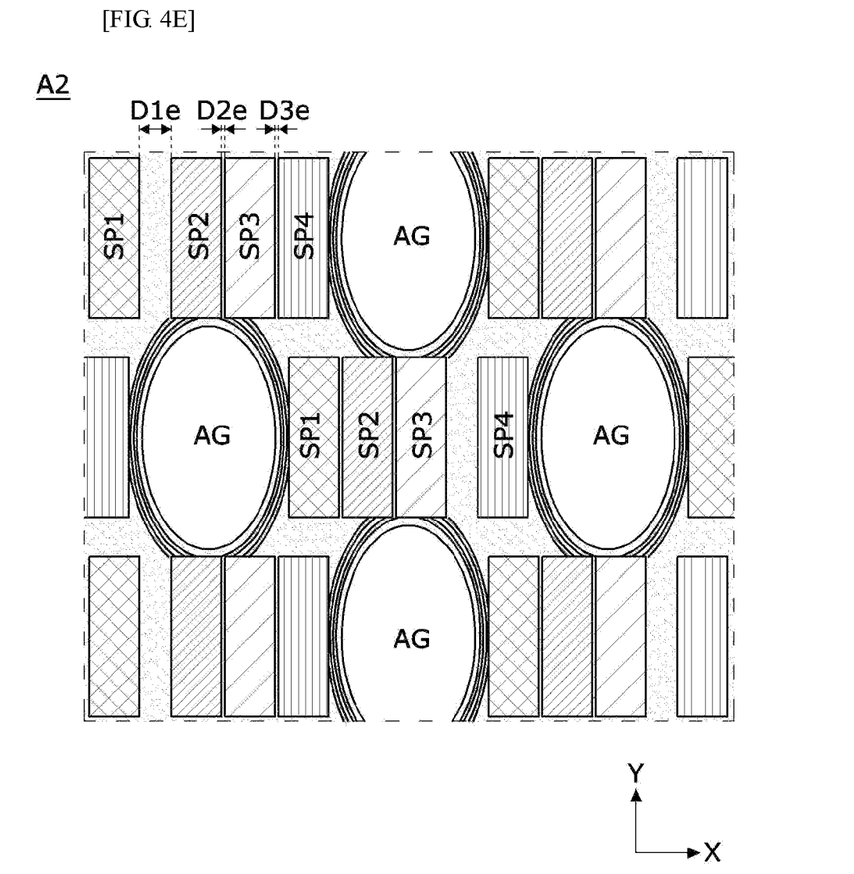

FIGS. 4D and 4E illustrate embodiments in which, among the sub-pixel areas, any three sub-pixel areas (e.g., "SP1, SP2, and SP3)" are adjacent to each other at an interval less than an interval with the remaining one sub-pixel area (e.g., "SP4"). That is, the four sub-pixel areas are divided into a first group including three sub-pixel areas on one side and a second group including the remaining one sub-pixel area on the other side, and an interval D1$d$ and D1$e$ between the first group and the second group is greater than an interval D2$d$, D3$d$, D2$e$, and D3$e$ between the sub-pixel areas in the first group. At this point, a group of the three sub-pixels may be selected as three on the left or three on the right. In addition, the arrangement form of the sub-pixel areas may be substantially constant in the entire second area A2 as in FIG. 4D, or may be horizontally symmetrical about the transmission area AG as in FIG. 4E.

When a description is made with reference to all of the above-described embodiments, a display device (e.g., an organic light-emitting display device) according to an embodiment of the present disclosure includes a display panel in which a plurality of sub-pixels form one pixel. The display panel may have a first area in which first pixels are disposed and a second area in which second pixels are disposed at a lower density than the first area. Here, each of the first pixels and the second pixels includes a plurality of sub-pixels. The second area may include second pixel areas for the second pixels and a first transmission area AG between the second pixel areas.

Meanwhile, the display device includes an optical sensor located to correspond to the second area. The optical sensor may capture an image through the second area. The second area may include a second transmission area between adjacent sub-pixel areas forming the second pixel area. Here, the optical sensor is provided to collect more uniform image data through the second area as compared with the display device in which the transmission area does not exist between the sub-pixel areas in the second area as shown in FIG. 2. That is, the image data obtained through the various embodiments illustrated in FIGS. 4A to 4E has a better quality as compared with the embodiment shown in FIG. 2 due to the small variation on the MTF curve.

Figure 5B:
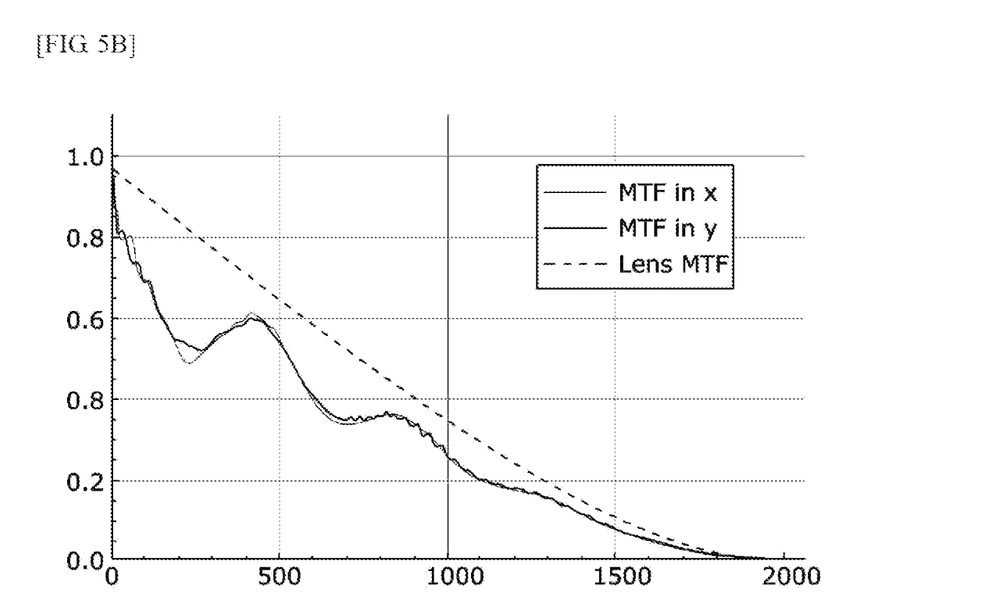

FIGS. 5A and 5B are diagrams for schematically describing an analysis of an image captured through the second area Referring to FIG. 5A, it can be seen that light is received through the sub-pixel areas in addition to the transmission areas AG. An MTF curve of image data collected under the above-described condition is shown in FIG. 5B. It was confirmed that rapidly decreasing points in a valley shape are reduced or the degree of decrease is reduced in the MTF curve of FIG. 5B as compared with FIG. 3B.

According to the embodiments of the present disclosure, a display device with improved performance of an optical device disposed in an active area can be provided. Accordingly, the display device equipped with the optical device according to the embodiments of the present disclosure can have improved aesthetics and functionality. The effects according to the embodiments of the present disclosure are not limited by the contents exemplified above, and more various effects are included in the present specification.

While the embodiments of the present disclosure have been described in detail above with reference to the accompanying drawings, the present disclosure is not necessarily limited to these embodiments, and various changes and modifications may be made without departing from the technical spirit of the present disclosure. Accordingly, the embodiments disclosed herein are to be considered descriptive and not restrictive of the technical spirit of the present disclosure, and the scope of the technical spirit of the present disclosure is not limited by these embodiments. The features of various embodiments of the present disclosure can be partially or entirely bonded to or combined with each other and can be interlocked and operated in various ways technically by those skilled in the art, and the embodiments can be carried out independently of or in association with each other.

The scope of the present disclosure should be construed by the appended claims along with the full range of equivalents to which such claims are entitled.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
   a first area in which first pixels are disposed at a first density; and
   a second area in which second pixels are disposed at a second density less than the first density;
   wherein the second area includes a plurality of second pixels and a transmission area disposed between adjacent second pixels of the plurality of second pixels,
   wherein the transmission area has a smooth curvature throughout an entire boundary of the transmission area,
   wherein the second pixels include a plurality of sub-pixels, the plurality of sub-pixels including a first sub-pixel, a second sub-pixel, a third sub-pixel, and a fourth sub-pixel disposed in a first direction,
   wherein each sub-pixel of a different color is spaced apart from another sub-pixel,
   wherein each of the second pixels are divided into a first group including two sub-pixels on one side and a second group including two sub-pixels on the other side,
   wherein a sub-pixel of a same color within either the first group or the second group is not spaced apart from the sub-pixel of the same color,
   wherein a first interval between the first group and the second group is greater than either a second interval between the two adjacent sub-pixels of the first group or a third interval between the two adjacent sub-pixels of the second group, wherein light is incident through the first to the third intervals and the transmission area,
   wherein conductive lines and an electrode layer are not disposed in the transmission area,
   wherein intervals between adjacent sub-pixels in the second pixels are 8% to 10% of a width of the transmission area, and
   wherein connection lines overlapped with the first to the third intervals are extended in a same direction,
   wherein the first interval overlaps with the smooth curvature of the transmission area in a second direction which is vertical to the first direction, and
   wherein a width of the first direction of the transmission area is smaller than a width of the first direction of each of the second pixels.

2. The display device of claim 1, wherein each of the plurality of sub-pixels is spaced apart from another sub-pixel, which is adjacent thereto in the first direction, at a selected interval to an extent that allows light to be transmitted therethrough.

3. The display device of claim 1, further comprising an optical sensor at a position corresponding to the second area.

4. The display device of claim 2, wherein some of the plurality of sub-pixels are spaced apart from another sub-pixel in the second direction with the transmission area therebetween.

5. The display device of claim 4, wherein some of the other of the plurality of sub-pixels are spaced apart from another sub-pixel in the second direction without having the transmission area therebetween.

6. The display device of claim 5, wherein a separation distance between the some of the other of the plurality of sub-pixels and another sub-pixel adjacent thereto in the second direction is greater than a separation distance between the plurality of sub-pixels in one of the plurality of second pixels.

7. The display device of claim 4, wherein at least some of the sub-pixels spaced apart from each other in the second direction are located on a straight line.

8. The display device of claim 2, wherein a separation distance between each of the plurality of sub-pixels and another sub-pixel adjacent thereto in the first direction is greater than or equal to about 9 micrometers.

9. The display device of claim 4, wherein four of the plurality of sub-pixels are disposed between transmission areas arranged in either the first direction or the second direction.

10. The display device of claim 1, wherein the transmission area is designed such that light is incident at a minimum loss.

11. The display device of claim 1, wherein the transmission areas is made of transparent materials.

12. An organic light-emitting display device in which a plurality of sub-pixels form one pixel, the organic light-emitting display device comprising:
   a display panel including a first area in which first pixels are disposed and a second area in which second pixels are disposed at a lower density than the first area; and
   an optical sensor located to correspond to the second area,
   wherein each of the first pixels and the second pixels includes a plurality of sub-pixels,
   wherein the second area includes second pixel and a first transmission area between the second pixels,
   wherein the first transmission area has a round shape throughout an entire boundary of the first transmission area,
   wherein the optical sensor is configured to collect image data through the second area,
   wherein the second pixels include a plurality of sub-pixels, the plurality of sub-pixels including a first sub-pixel, a second sub-pixel, a third sub-pixel, and a fourth sub-pixel disposed in a first direction,
   wherein each sub-pixel of a different color is spaced apart from another sub-pixel,
   wherein each of the second pixels are divided into a first group including three sub-pixels on one side and a second group including one sub-pixel on the other side,
   wherein a sub-pixel of a same color within either the first group or the second group is not spaced apart from the sub-pixel of the same color,
   wherein a first interval between the first group and the second group is greater than a second interval between the two adjacent sub-pixels within the first group, wherein light is incident to the optical sensor through the first to the third intervals and the first transmission area, wherein conductive lines and an electrode layer are not disposed in the first transmission area, wherein intervals between adjacent sub-pixels in the second pixels are 8% to 10% of a width of the first transmission area, and wherein connection lines overlapped with the first to the third intervals are extended in a same direction, wherein the first interval overlaps with the smooth curvature of the first transmission area in a second direction which is vertical to the first direction, and wherein a width of the first direction of the first transmission area is smaller than a width of the first direction of each of the second pixels.

13. The organic light-emitting display device of claim 12, wherein the second area includes a second transmission area between adjacent sub-pixels forming the second pixel, and wherein the optical sensor, in operation, collects more uniform image data through the second area as compared with a display device in which a transmission area is not present between adjacent sub-pixels.

14. The organic light-emitting display device of claim 13, wherein, in operation, the organic light-emitting display device has a smaller amount of rapid decrease in a modulation transfer function curve of acquired image data than a display device in which the transmission area is not present between adjacent sub-pixels in the second area.

15. The display device of claim 1, wherein, in operation, an image captured through the transmission area has a boundary corresponding to the boundary of the transmission area having the smooth curvature.

16. The display device of claim 1, wherein the transmission area includes either a circular shape or an oval shape.

17. The display device of claim 12, wherein the four sub-pixels are substantially symmetrical with other four sub-pixels in the first direction about the transmission area.

* * * * *